United States Patent [19]
Münz

[11] Patent Number: 5,259,941
[45] Date of Patent: Nov. 9, 1993

[54] VAPORIZER FOR VACUUM COATING APPARATUS

[75] Inventor: Wolf-Dieter Münz, Venlo, Netherlands

[73] Assignee: Hauzer Holding BV, Venlo, Netherlands

[21] Appl. No.: 837,199

[22] Filed: Feb. 14, 1992

[30] Foreign Application Priority Data

Feb. 21, 1991 [DE] Fed. Rep. of Germany ... 9102052[U]

[51] Int. Cl.⁵ .............................................. C23C 14/34
[52] U.S. Cl. .................... 204/298.09; 204/192.12; 204/298.12; 204/298.19
[58] Field of Search ................ 204/298.09, 298.12, 204/192.12, 298.19; 118/724, 726

[56] References Cited

U.S. PATENT DOCUMENTS

| | | | |
|---|---|---|---|
| 4,169,031 | 9/1979 | Brors | 204/298.09 X |
| 4,209,375 | 6/1980 | Gates et al. | 204/298.12 X |
| 4,318,796 | 3/1982 | Nishiyama et al. | 204/298.09 |
| 4,434,042 | 2/1984 | Keith | 204/298.09 |
| 4,448,652 | 5/1984 | Pachonik | 204/298.09 |
| 4,468,313 | 8/1984 | Okumura et al. | 204/298.12 |
| 4,517,070 | 5/1985 | Kisner | 204/298.09 |
| 4,966,676 | 10/1990 | Fukasawa et al. | 204/298.12 |

FOREIGN PATENT DOCUMENTS

| | | | |
|---|---|---|---|
| 0393344 | 10/1990 | European Pat. Off. | 204/298.09 |
| 2-258974 | 10/1990 | Japan | 204/298.09 |
| 0672319 | 11/1989 | Switzerland | 204/298.09 |
| 0823459 | 4/1981 | U.S.S.R. | 204/298.09 |

Primary Examiner—Nam Nguyen
Attorney, Agent, or Firm—Townsend and Townsend Khourie and Crew

[57] ABSTRACT

A vaporizer is described for use in an apparatus for the coating of substrate under vacuum, the vaporizer comprising a holder and a target plate releasably securable to the holder, with the target plate being acted on at its rear side by a coolant medium which flows through the holder. In order to make rapid interchange of the target plate possible while simultaneously optimizing the cooling, the target plate is fixed to the holder via a clamped connection with intermeshing clamping surfaces.

3 Claims, 1 Drawing Sheet

VAPORIZER FOR VACUUM COATING APPARATUS

BACKGROUND OF THE INVENTION

The invention relates to a vaporizer, in particular for use in an apparatus for the coating of substrates under vacuum.

In general one understands a process for the vapor deposition or coating to mean the vaporization of at least one material which is present in the form of a target, and indeed for the purpose of condensing this material or these materials, on diverse substrates or products. This process of vapor deposition is carried out under vacuum in order to ensure a controllable and reproducible atmosphere. For the supply of different gases during target vaporization a reaction arises between the vaporized target material and the reactive gases. In this way the most diverse layers can be produced for the improvement of substrate surfaces.

An important component of apparatus of carrying out a substrate coating process of this kind is the so-called vaporizer. This vaporizer must be manufactured so that heat can be led away during the vaporizing on the target material. It is known to mount the target plate for this purpose on a special holder and to directly cool the rear side of the target plate by means of a coolant consisting for example of water. The target plate is thereby fixed on the target holder by screw connections, with this fixation or connection of the target plate with the target holder having to take place in such a way that a penetration of the coolant into the vacuum system can be reliably avoided.

The screw connections used in known vaporizers for the fixation of the target plate are always associated with the disadvantage that the thread space is difficult to evacuate. As screw connections under vacuum can moreover not be lubricated, the danger exists that the screw connections can no longer be released. Finally, with these screw connections it is also disadvantageous that the amount of time required to interchange a target plate is relatively large.

A further disadvantage of known vaporizers lies in the direct cooling of the rear side of the target plate, since the danger exists that the vacuum closure will leak. This occurs in particular with specific target materials, and indeed with frequent change of the target plates also due to wear of the sealing material. Even very small quantities of the coolant liquid entering into the vacuum system can have disastrous effects on the vacuum process. Finally, it can also transpire that on changing the target plate residues of the coolant contaminate the system. Summarizing, it can be noted with respect to customary vaporizers that their direct cooling and screw mounting to a target holder causes grave problems during change of the target plate and also an undesired high expenditure of time.

SUMMARY OF THE INVENTION

The object underlying the invention is to avoid the disadvantages of the known vaporizers and to provide a vaporizer of the initially named kind which not only makes it possible to rapidly change the respective target plate without problems but also simultaneously ensures ideal cooling while avoiding the danger of contamination of the vacuum space.

This object is satisfied in accordance with the invention essentially in that the target plate is fixed to the holder via a clamping connection with intermeshing clamping surfaces. This clamping connection is preferably formed as a bayonet clamping connection.

In addition to the advantage of reducing or practically avoiding screw connections the measures of the invention also achieve a minimization of the time required to change the target. A copper foil is preferably present between the coolant and the target. The copper foil is connected in vacuum-tight manner with the target holder and guarantees a troublefree vacuum closure. During the interchanging of the target plate it is thus not possible for a contamination of the system by the coolant to take place.

A further important advantage of the vaporizer of the invention lies in the fact that the thickness of the copper foil is so selected that during the cooling of the vaporizer the pressure of the coolant presses the copper foil against the target plate. This has, on the one hand, the advantage that a good thermal exchange takes place between the target plate and the coolant, and on the other hand, that the target plate is automatically fixed against the clamped closure, in particular the bayonet closure, and indeed through the pressure of the coolant liquid.

It is of particular advantage in practice that the vaporizer is laid out in such a way that its rear side or atmospheric side is readily accessible and favors installation of the required magnet configuration. This magnetic configuration can namely be mounted as close as possible to the target plate which is also favored by the fact that with the inventive layout of the vaporizer the thickness of the target frame behind the target plate is minimal.

Although the use of a bayonet closure as a clamped connection between the target holder and the target plate is preferred, clamped connections of other kinds, for example, sliding guided connections or dovetail connections, can also be used while realizing the described advantages of the invention.

BRIEF DESCRIPTION OF THE DRAWINGS

The invention will now be explained in the following in more detail with reference to an embodiment and to the drawing, in which are shown.

DESCRIPTION OF THE PREFERRED EMBODIMENTS

Figure 1:
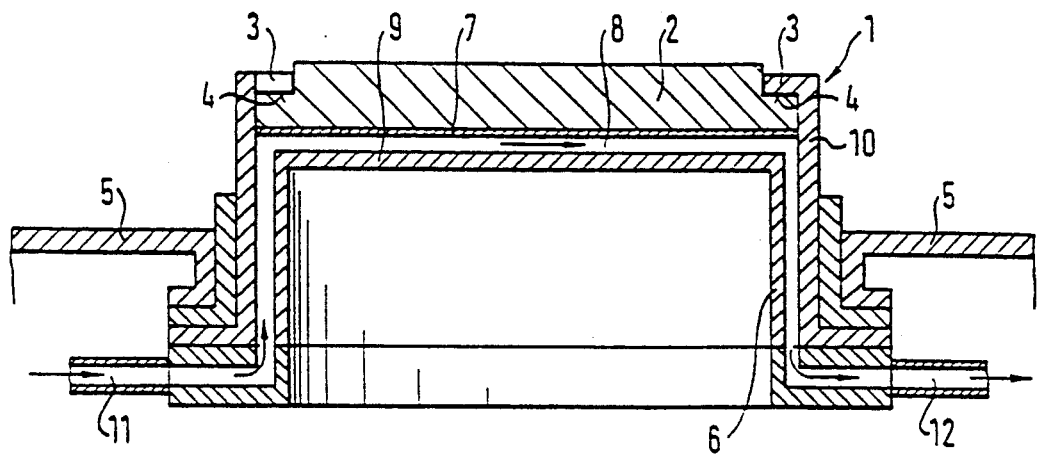
FIG. 1 is an axial section of a vaporizer in accordance with the invention.

FIG. 1 shows a target holder characterized with the general reference numeral 1 which is sealingly connected to a vacuum vessel 5 which is only partially illustrated.

This target holder 1 comprises an outer cylinder 10 and an inner cylinder 6 which is arranged coaxial to and spaced from the outer cylinder 10.

At its free end the outer cylinder 10 has holding means for an interchangeable target plate 2. In the direction towards the target plate 2 the inner cylinder 6 is closed by a terminal wall 9 and the outer cylinder 10 is closed by a metallic foil 7. A flow space 8 for a coolant is formed between the terminal wall 9 and the metallic foil 7.

The supply of coolant takes place via a coolant supply line 11 which extends radially with respect to the inner cylinder 6 and the outer cylinder 10 and the discharge takes place via a coolant discharge line 12 which is preferably disposed diametrically opposite thereto.

The metallic foil 7 which separates the coolant space from the vacuum chamber within the vessel 5 is connected in vacuum tight manner with the outer cylinder 10 and indeed preferably by high temperature brazing, whereby a troublefree vacuum closure is guaranteed.

The metallic foil 7, which preferably consists of a copper foil, not only has the task of reliably precluding any penetration of coolant into the vacuum vessel, but rather it also ensures, as a result of its high thermal conductivity and its full area contact with the target 2, a particularly good thermal transfer between the target 2 and the coolant liquid. Moreover, it has the important task of assisting the clamped fixation of the target plate 2.

The securing of the target plate 2 to the holder 1 takes place via a clamped connection by means of intermeshing clamping surfaces 3, 4, and these clamping surfaces can be brought into engagement via a displacement and/or relative rotation between the holder 1 and the target plate 2. In the illustrated embodiment this clamping connection takes place through a relative rotation as the clamped connection forms a bayonet closure. When the clamping surfaces 3, 4 adopt their desired relative position and the target plate 2 is thus fixed relative to the holder 1, a clamping or holding pressure is exerted onto the clamping surfaces 3, 4 via the metallic foil 7 following the build-up of the coolant liquid pressure and the securing of the target plate 2 in the holder 1 is thereby effectively aided.

Figure 2:
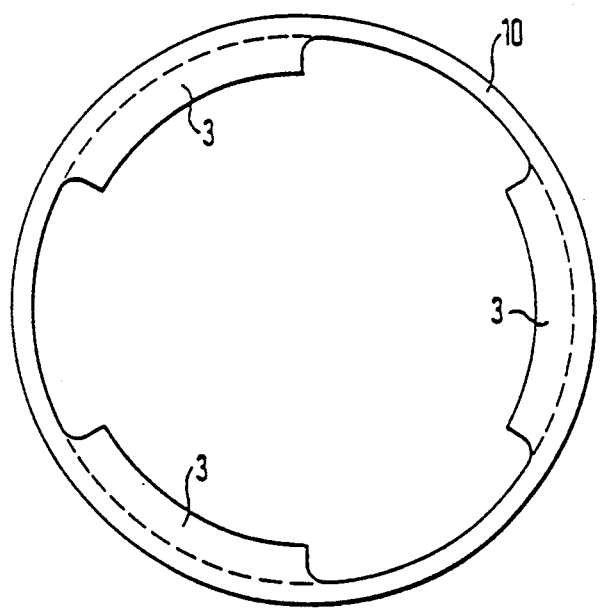
FIG. 2 is a plane view of the bayonet holder of FIG. 1.

The plan view of FIG. 2 shows three clamping surfaces 3 which are uniformly distributed around the periphery, which project radially inwardly with respect to the outer cylinder 10 and which engage over correspondingly formed clamping surfaces on the target plate 2 when the target plate 2 is inserted and transferred into the fixed position through a rotary movement.

The important advantages of the vaporizer design of the invention in comparison to known arrangements lies in the fact that the vacuum-tight connections are decisively improved, that contamination of the system during the interchange of the target plate can be precluded, that the time required to interchange that the target plate has been minimized, that the reliability of the vaporizer with respect to the danger of leakage is increased in addition to the troublefree mounting of the target plate, and that the required configuration of magnets can be arranged in ideally effective and accessible position within the inner cylinder 6.

What is claimed is:

1. A vaporizer for use with apparatus for coating substrates under a vacuum, the vaporizer comprising a holder including an outer cylinder extending into a vacuum vessel and having a free end, an inner cylinder coaxial with the outer cylinder and having a terminal wall facing towards the free end of the outer cylinder, and a coolant flow space formed between the outer and inner cylinders and by the terminal wall; a target plate positioned so the coolant flow space is on a rear side of the target plate which faces towards the inner cylinder; the free end of the outer cylinder forming bayonet clamping surfaces defining a quick release connection for releasably securing the target plate to the holder; and a metallic foil located opposite the terminal wall of the inner cylinder proximate the target plate and secured over its entire periphery to the outer cylinder in a vacuum-tight manner to form a terminal wall of the outer cylinder which faces the coolant flow space; whereby a cooling medium in the coolant flow space acts against the foil, brings it into intimate contact with the target plate and thereby provides an efficient heat exchange from the target plate via the foil to the cooling medium in the coolant flow space.

2. A vaporizer according to claim 2 wherein the metal foil comprises copper, and including a connection between the foil and the outer cylinder selected from the group consisting of soldering and brazing securing the foil to the outer cylinder in said vacuum-tight manner.

3. A vaporizer according to claim 3 wherein the inner cylinder forms a receiving chamber for a magnet.

* * * * *